United States Patent
Wang et al.

(10) Patent No.: US 7,750,837 B2
(45) Date of Patent: Jul. 6, 2010

(54) ADAPTIVE BIAS CURRENT GENERATION FOR SWITCHED-CAPACITOR CIRCUITS

(75) Inventors: Chuanyang Wang, San Diego, CA (US); Xiaohong Quan, San Diego, CA (US); Seyfollah Bazarjani, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 12/185,046

(22) Filed: Aug. 1, 2008

(65) Prior Publication Data

US 2010/0026542 A1 Feb. 4, 2010

(51) Int. Cl.
*H03M 1/12* (2006.01)
(52) U.S. Cl. ...................................... 341/172
(58) Field of Classification Search ................ 341/172, 341/155, 139, 131, 134, 122, 143, 118
See application file for complete search history.

(56) References Cited

U.S. PATENT DOCUMENTS

| | | | |
|---|---|---|---|
| 3,848,195 A * | 11/1974 | Kiko | 330/261 |
| 6,407,623 B1 | 6/2002 | Bazarjani et al. | |
| 6,535,039 B2 * | 3/2003 | Nanba et al. | 327/170 |
| 6,552,676 B1 * | 4/2003 | Bjorksten et al. | 341/143 |
| 7,002,501 B2 * | 2/2006 | Gulati et al. | 341/155 |
| 2005/0140422 A1 | 6/2005 | Klemmer | |
| 2008/0284406 A1 * | 11/2008 | Kapusta, Jr. | 323/318 |

FOREIGN PATENT DOCUMENTS

EP 1168603 1/2002

OTHER PUBLICATIONS

Andersen et al., A Cost-Effective High-Speed 12-bit Pipeline ADC in 0.18-μm Digital CMOS, IEEE Journal of Solid-State Circuits, Jul. 2005, pp. 1506-1513, vol. 40, No. 7.
International Search Report - PCT/US09/052593, International Searching Authority - European Patent Office, Sep. 23, 2009.
Written Opinion - PCT/US09/052593, International Searching Authority - European Patent Office, Sep. 23, 2009.

* cited by examiner

*Primary Examiner*—Peguy JeanPierre
(74) *Attorney, Agent, or Firm*—Jiayu Xu

(57) ABSTRACT

Techniques for adaptively generating bias current for a switched-capacitor circuit are described. The switched-capacitor circuit charges and discharges at least one switching capacitor at a sampling rate and may be a $\Sigma\Delta$ ADC that digitizes an analog signal at the sampling rate and provides digital samples. The switched-capacitor circuit may support multiple modes associated with different sampling rates. A bias circuit generates a bias current for the switched-capacitor circuit to be proportional to the sampling rate for a selected mode, to provide a bandwidth proportional to the sampling rate for an operational transconductance amplifier (OTA) within the switched-capacitor circuit, and to track changes in the switching capacitor(s) due to variations in integrated circuit (IC) process and temperature. The settling time of the switched-capacitor circuit may track with the multiple modes and across IC process and temperature variations.

29 Claims, 5 Drawing Sheets

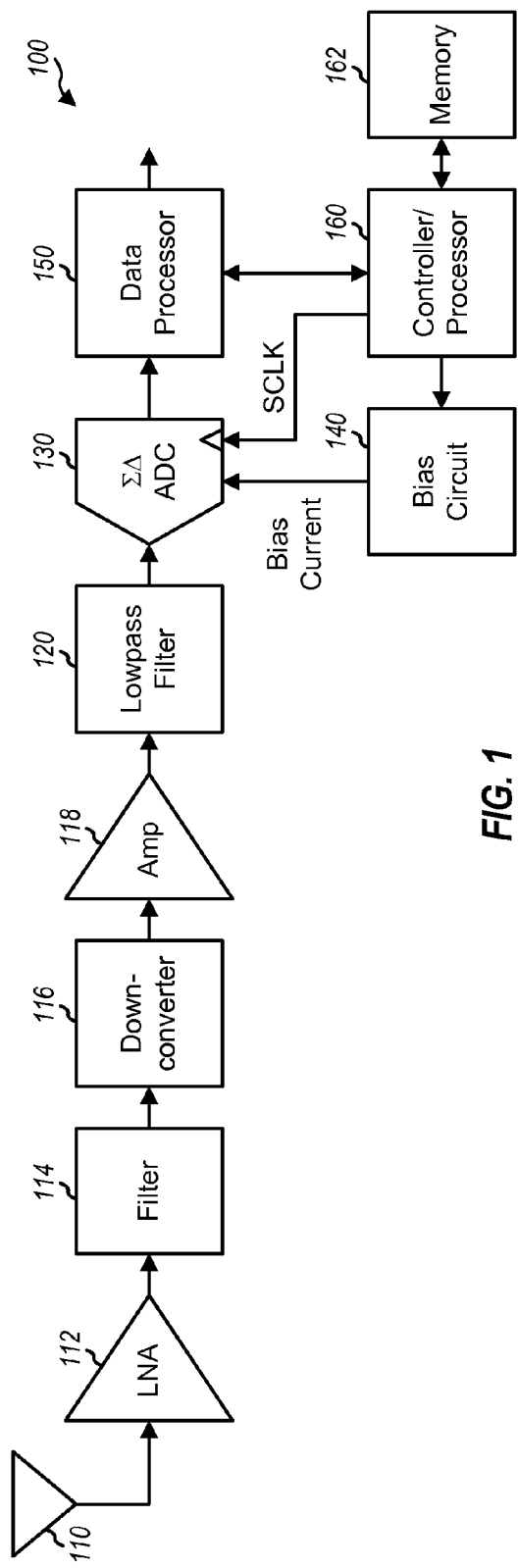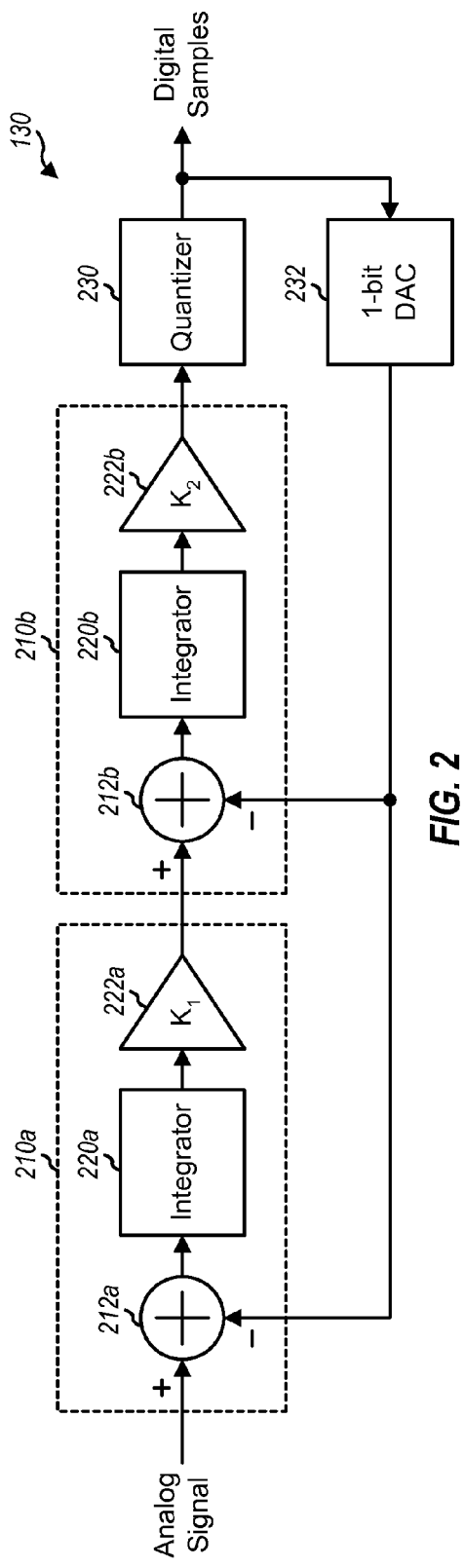

ADAPTIVE BIAS CURRENT GENERATION FOR SWITCHED-CAPACITOR CIRCUITS

BACKGROUND

I. Field

The present disclosure relates generally to electronics, and more specifically to techniques for generating bias current for switched-capacitor circuits.

II. Background

A switched-capacitor circuit is a circuit that moves charges between different sampling capacitors in order to achieve a desired signal processing function. The switched-capacitor circuit can accurately implement the signal processing function based on ratios of capacitor sizes (instead of absolute capacitor sizes) and a sampling rate, both of which can often be obtained with high precision. Switched-capacitor circuits are widely used to implement various circuit blocks such as sigma-delta analog-to-digital converters ($\Sigma\Delta$ ADCs), sigma-delta digital-to-analog converters ($\Sigma\Delta$ DACs), filters, decimators, etc.

A switched-capacitor circuit typically includes an active circuit such as an operational transconductance amplifier (OTA) that helps to move charges between the sampling capacitors. The active circuit may be biased with a large amount of current in order to provide satisfactory performance under worst-case conditions. This may then result in the active circuit being biased with excessive current most of the time, which may be undesirable.

SUMMARY

Techniques for adaptively generating bias current for switched-capacitor circuits to achieve the desired performance while reducing power consumption are described herein. In one design, an apparatus includes a switched-capacitor circuit and a bias circuit. The switched-capacitor circuit includes (i) at least one switching capacitor that is charged and discharged at a sampling rate and (ii) an amplifier such as an operational transconductance amplifier (OTA) having a bandwidth proportional to a bias current. The bias circuit generates the bias current for the switched-capacitor circuit (i) to obtain a bandwidth proportional to the sampling rate for the amplifier and (ii) to track changes in the switching capacitor(s) due to variations in integrated circuit (IC) process and temperature.

In one design, the switched-capacitor circuit comprises a $\Sigma\Delta$ ADC that digitizes an analog signal at the sampling rate and provides digital samples. The $\Sigma\Delta$ ADC may support multiple modes associated with different sampling rates. One mode may be selected from among the supported modes. The bias circuit may then generate the bias current to be proportional to the sampling rate for the selected mode. The settling time of the switched-capacitor circuit may track with the multiple modes and across IC process and temperature variations. In other designs, the switched-capacitor circuit may comprise a filter, a decimator, or some other circuit.

In one design, the bias circuit includes a switched capacitor load, a driver circuit, and a current mirror. In one design, the switched capacitor load includes (i) a first capacitor that is discharged based on a first control signal and charged based on a second control signal, (ii) a second capacitor that is discharged based on the second control signal and charged based on the first control signal, and (iii) a third capacitor that filters the charging current for the first and second capacitors. The bias current may be proportional to the first and second capacitors, which may track the switching capacitor(s) in the switched-capacitor circuit through variations in IC process and temperature. The driver circuit provides the charging current for the first and second capacitors in the switched capacitor load. The current mirror receives the charging current and provides the bias current.

Various aspects and features of the disclosure are described in further detail below.

BRIEF DESCRIPTION OF THE DRAWINGS

FIG. 1 shows a block diagram of a wireless communication device.

FIG. 2 shows a block diagram of a second-order $\Sigma\Delta$ ADC.

DETAILED DESCRIPTION

Figure 3:
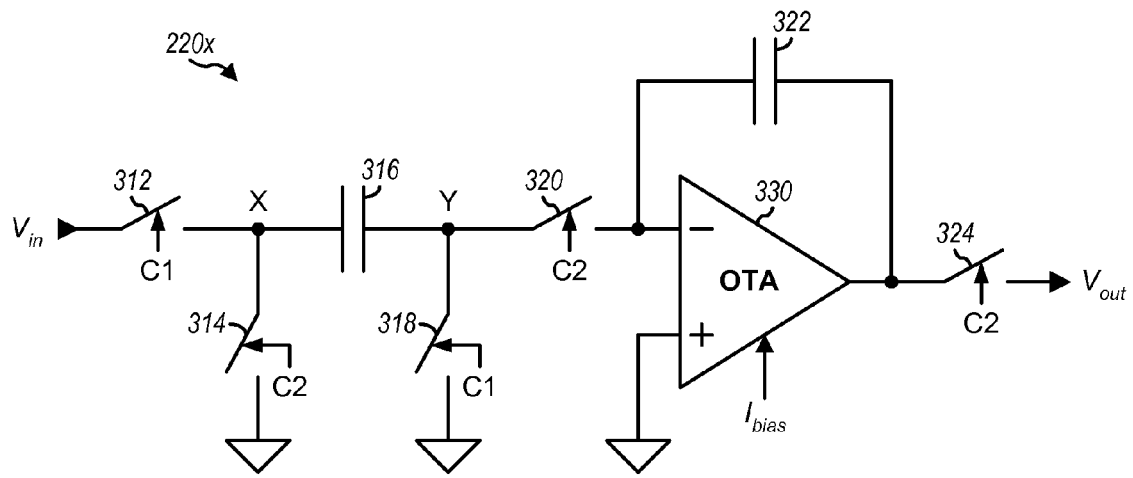
FIG. 3 shows a schematic diagram of an integrator within the $\Sigma\Delta$ ADC.

The techniques described herein may be used for switched-capacitor circuits used for various circuit blocks such as $\Sigma\Delta$ ADCs, $\Sigma\Delta$ DACs, filters, decimators, etc. The techniques may also be used for various applications such as wireless communication, computing, networking, consumer electronics, etc. The techniques may also be used for various devices such as wireless communication devices, cellular phones, personal digital assistants (PDAs), handheld devices, wireless modems, laptop computers, cordless phones, Bluetooth devices, broadcast receivers, consumer electronics devices, etc. For clarity, the use of the techniques in a wireless communication device, which may be a cellular phone or some other device, is described below.

FIG. 1 shows a block diagram of a design of a wireless communication device 100. For simplicity, only the receiver portion is shown in FIG. 1. Also for simplicity, only one receive chain for one antenna is shown in FIG. 1. In general, a wireless device may include any number of receive chains for any number of antennas, any number of frequency bands, and any number of radio technologies.

An antenna 110 receives radio frequency (RF) modulated signals transmitted by base stations and provides a received RF signal. A low noise amplifier (LNA) 112 amplifies the received RF signal and provides an amplified RF signal. A filter 114 filters the amplified RF signal to pass signal components in a frequency band of interest and to remove out-of-band noise and undesired signals. A downconverter 116 frequency downconverts the filtered RF signal with a local oscillator (LO) signal and provides a downconverted signal. The frequency of the LO signal is selected such that a desired signal in a selected frequency channel is downconverted to baseband or near-baseband. An amplifier (Amp) 118 amplifies the downconverted signal and provides a signal having a desired signal level. A lowpass filter 120 filters the signal from amplifier 118 to pass the desired signal in the selected frequency channel and to remove noise and undesired signals that may be generated by the downconversion process.

A $\Sigma\Delta$ ADC 130 digitizes the analog signal from lowpass filter 120 based on a sampling clock SCLK and provides digital samples to a data processor 150. $\Sigma\Delta$ ADC 130 may provide certain advantages such as better linearity, improved quantization noise characteristics, and simpler implementation over other types of ADC. ΣΔ ADC 130 can perform analog-to-digital conversion of the analog signal by making successive one-bit approximations of the change in the amplitude of the analog signal at a sampling rate that is many times greater than the desired signal bandwidth. The digital samples include the desired signal and quantization noise. ΣΔ ADC 130 may be designed such that the quantization noise is pushed (or noise shaped) out of band so that it can be more easily filtered.

A bias circuit 140 generates a bias current for ΣΔ ADC 130 as described below. ΣΔ ADC 130 and bias circuit 140 may be implemented on an analog IC, an RF IC (RFIC), a mixed signal IC, an application specific integrated circuit (ASIC), etc.

Data processor 150 may include various units for processing the digital samples from ΣΔ ADC 130. For example, data processor 150 may include one or more digital signal processors (DSPs), reduced instruction set computer (RISC) processors, central processing units (CPUs), etc. A controller/processor 160 may control the operation at wireless device 100. Controller/processor 160 may generate the sampling clock for ΣΔ ADC 130 and control signals for bias circuit 140, as shown in FIG. 1. The sampling clock and control signals may also be generated by some other unit within wireless device 100. A memory 162 may store program codes and data for wireless device 100.

FIG. 1 shows a design of a receiver implemented with a direct-conversion architecture, which is also referred to as a zero-IF (ZIF) architecture. In the direct-conversion architecture, an RF signal is frequency downconverted directly from RF to baseband in one stage. A receiver may also be implemented with a super-heterodyne architecture in which an RF signal is frequency downconverted in multiple stages, e.g., from RF to an intermediate frequency (IF) in one stage, and then from IF to baseband in another stage. The super-heterodyne and direct-conversion architectures may use different circuit blocks and/or have different requirements.

FIG. 1 shows a specific receiver design with a ΣΔ ADC. A receiver may also include different and/or additional circuit blocks not shown in FIG. 1. For example, ΣΔ ADC 130 may be replaced with a regular ADC, lowpass filter 120 may be replaced with a switched-capacitor filter, etc. In general, a receiver may include any number of switched-capacitor circuits for any number of circuit blocks. For simplicity, much of the description below assumes that ΣΔ ADC 130 is the only switched-capacitor circuit within wireless device 100.

Wireless device 100 may support one or more radio technologies for wireless communication, terrestrial broadcast, satellite communication, etc. For example, wireless device 100 may support one or more of the following radio technologies:

- Global System for Mobile Communications (GSM), Wideband Code Division Multiple Access (WCDMA), Long Term Evolution (LTE), and/or other radio technologies from an organization named "3rd Generation Partnership Project" (3GPP),
- CDMA2000 1X (or simply, 1X), CDMA2000 1xEV-DO (or simply, 1xEV-DO), Ultra Mobile Broadband (UMB), and/or other radio technologies from an organization named "3rd Generation Partnership Project 2" (3GPP2),
- IEEE 802.11 (Wi-Fi), IEEE 802.16 (WiMAX), IEEE 802.20, and/or other radio technologies from IEEE,
- Digital Video Broadcasting for Handhelds (DVB-H), Integrated Services Digital Broadcasting for Terrestrial Television Broadcasting (ISDB-T), MediaFLO™, and/or other digital broadcast technologies, and
- United States Global Positioning System (GPS), European Galileo, Russian GLONASS, or Global Navigation Satellite System (GNSS).

Wireless device 100 may support multiple modes of operation for one or more radio technologies. Each mode may be for a specific signal bandwidth in a specific radio technology. LTE and UMB support variable signal bandwidth, and multiple modes may be defined for different possible signal bandwidths in LTE and UMB. ΣΔ ADC 130 and other switched-capacitor circuits within wireless device 100 may be designed to handle all of the modes supported by wireless device 100.

ΣΔ ADC 130 may be implemented with various designs such as a single-loop ΣΔ ADC, a MASH ΣΔ ADC, etc. ΣΔ ADC 130 may also be implemented with any order, e.g., first order, second order, or higher order. In general, higher order may provide better performance at the expense of greater circuit complexity.

FIG. 2 shows a block diagram of a second-order ΣΔ ADC 130, which is one design of ΣΔ ADC 130 in FIG. 1. ΣΔ ADC 130 includes two sections 210a and 210b coupled in series, a quantizer 230, and a 1-bit DAC 232.

Within section 210a, a summer 212a subtracts a quantized signal outputted by DAC 232 from an analog signal. The output of summer 212a is integrated by an integrator 220a and amplified with a gain of $K_1$ by an amplifier 222a to obtain an output of section 210a. Within section 210b, a summer 212b subtracts the quantized signal from the output of section 210a. The output of summer 212b is integrated by an integrator 220b and amplified with a gain of $K_2$ by an amplifier 222b to obtain an output of section 210b. Quantizer 230 compares the output of section 210b against a reference voltage and provides 1-bit digital samples based on the comparison results. DAC 232 converts the digital samples to analog and provides the quantized signal.

Integrators 220a and 220b may be implemented with various switched-capacitor circuit designs such as a single-sampling switched capacitor circuit, a correlated double-sampling (CDS) circuit, an auto-zeroing (AZ) circuit, a chopper stabilization (CS) circuit, etc. A switched capacitor circuit employs one or more amplifiers, capacitors, and switches, all of which may be readily fabricated in complementary metal oxide semiconductor (CMOS).

FIG. 3 shows a schematic diagram of a design of an integrator 220x implemented with a single-sampling switched capacitor circuit. Integrator 220x may be used for each of integrators 220a and 220b in FIG. 2. Within integrator 220x, a switch 312 has one end receiving an input signal $V_{in}$ and the other end coupled to node X. A switch 314 is coupled between node X and circuit ground. A capacitor 316 is coupled between node X and node Y. A switch 318 is coupled between node Y and circuit ground. A switch 320 is coupled between node Y and an inverting input of an operational transconductance amplifier (OTA) 330. The non-inverting input of OTA 330 is coupled to circuit ground. A capacitor 322 is coupled between the inverting input and the output of OTA 330. A switch 324 has one end coupled to the output of OTA 330 and the other end providing an output signal $V_{out}$. Switches 312 and 318 are controlled by a C1 control signal, and switches 314, 320 and 324 are controlled by a C2 control signal. OTA 330 receives a bias current of $I_{bias}$.

Integrator 220x operates as follows. During a first phase, switches 312 and 318 are closed by logic high on the C1 signal, switches 314, 320 and 324 are opened by logic low on the C2 signal, and capacitor 316 is charged by the input signal $V_{in}$. During a second phase, switches 314, 320 and 324 are closed by logic high on the C2 signal, switches 312 and 318 are opened by logic low on the C1 signal, and the charge on capacitor 316 is transferred to capacitor 322, which causes the output signal $V_{out}$ to vary. In each sampling clock cycle, capacitor 316 is charged by the input signal and subsequently transfers its charge to capacitor 322.

As shown in FIG. 2, an integrator is a fundamental component of a ΣΔ ADC as well as other types of switched-capacitor circuit. Different ΣΔ ADC designs may include different numbers of integrators and/or different configurations of integrators. As shown in FIG. 3, an integrator may be implemented with an OTA, switching capacitors, and switches. The OTA moves charges between switching capacitors, e.g., from capacitor 316 to capacitor 322 in FIG. 3. The charge transfer speed and accuracy are dependent on the amount of bias current provided to the OTA and the sizes of the capacitors. If the charge transfer speed is not sufficiently fast, then the charges on the capacitors will not be fully transferred within one clock cycle, and the performance of the ΣΔ ADC may degrade.

As noted above, wireless device 100 may support multiple modes for multiple radio technologies. Different modes may be associated with different signal bandwidths. For example, wireless device 100 may support two modes for GSM and WCDMA. The signal bandwidth for GSM may be 100 kilohertz (KHz) whereas the signal bandwidth for WCDMA may be 1.92 megahertz (MHz).

The speed requirement of ΣΔ ADC 130 may be different for different modes. In general, progressively faster speed is needed for ΣΔ ADC 130 for progressively larger signal bandwidth. To support multiple modes, ΣΔ ADC 130 may be designed with programmable speed. A relatively complex programmable bias circuit may be used to generate the programmable bias current for ΣΔ ADC 130 for different modes. However, for each mode, the speed of ΣΔ ADC 130 may vary widely due to variations in IC process and temperature. To combat this, the bias current may be generated with sufficiently large margin in order to ensure that the speed of ΣΔ ADC 130 can meet system requirements even under worst-case conditions. Since the worst-case conditions may be encountered infrequently, excessive bias current may be used for ΣΔ ADC 130 in most cases. The power consumption and die area of ΣΔ ADC 130 may not be optimal.

In an aspect, a switched capacitor circuit (e.g., a ΣΔ ADC) may be designed and operated to have performance that can be varied based on the sampling rate. This may be achieved by with (i) an OTA having a loopgain bandwidth that is proportional to a bias current and (ii) a bias circuit that can generate the bias current to be proportional to the sampling rate and capacitance. This may allow the speed of the switched-capacitor circuit to be varied for different modes by changing the bias current. This may also ensure that the speed of the switched-capacitor circuit and the resulting performance will be sufficient across variations in IC process and temperature.

Figure 4:
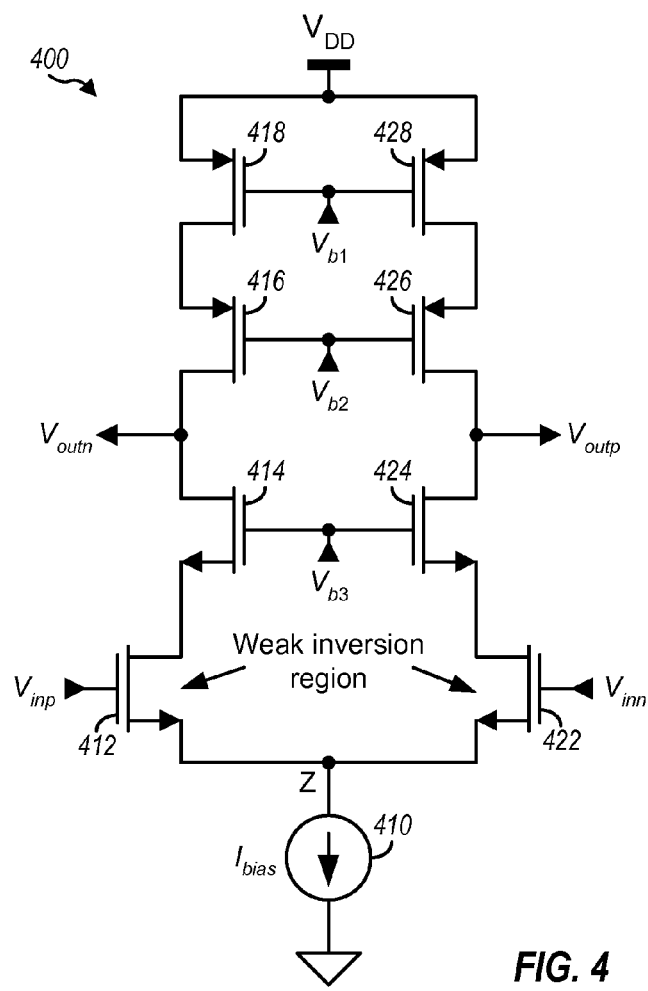
FIG. 4 shows a schematic diagram of an OTA.

FIG. 4 shows a schematic diagram of a design of an OTA 400 having loopgain bandwidth proportional to bias current. OTA 400 may be used for OTA 330 in FIG. 3. Within OTA 400, a current source 410 is coupled between node Z and circuit ground and provides a bias current of $I_{bias}$. N-channel metal oxide semiconductor (NMOS) transistors 412 and 422 have their sources coupled to node Z and their gates coupled to a non-inverting input ($V_{inp}$) and an inverting input ($V_{inn}$), respectively, of OTA 400. NMOS transistors 414 and 424 have their gates receiving a bias voltage $V_{b3}$, their sources coupled to the drains of NMOS transistors 412 and 422, respectively, and their drains coupled to an inverting output ($V_{outn}$) and a non-inverting output ($V_{outp}$), respectively. P-channel MOS (PMOS) transistors 416 and 426 have their gates receiving a bias voltage $V_{b2}$ and their drains coupled to the drains of NMOS transistors 414 and 424, respectively. PMOS transistors 418 and 428 have their sources coupled to a power supply voltage $V_{DD}$, their gates receiving a bias voltage $V_{b1}$, and their drains coupled to the sources of PMOS transistors 416 and 426, respectively.

In general, a MOS transistor may be operated in one of three regions—a saturation or strong inversion region, a linear region, and a weak inversion region. In one design, NMOS transistors 412 and 422 may be operated in the weak inversion region such that the transconductance $g_m$ of OTA 400 is proportional to bias current, or $g_m = K \cdot I_{bias}$, where K is a scaling factor. The loopgain bandwidth of OTA 400 may then be expressed as:

$$BW = \frac{g_m}{C} = \frac{K \cdot I_{bias}}{C},\qquad\text{Eq(1)}$$

where C is the capacitance of an integrator capacitor (e.g., capacitor 322 in FIG. 3), and BW is the loopgain bandwidth of OTA 400.

As shown in equation (1), by operating NMOS transistors 412 and 422 in the weak inversion region, and the loopgain bandwidth of OTA 400 may be varied by changing the $I_{bias}$ current. NMOS transistors 412 and 422 may be operated in the weak inversion region by selecting the size of the NMOS transistors to be sufficiently large such that $V_{gs} - V_{th} \cong 0$, where $V_{gs}$ is a gate-to-source voltage and $V_{th}$ is a threshold voltage.

In one design, the $I_{bias}$ current of the switched-capacitor circuit may be adaptively generated to track changes in capacitor size due to variations in IC process and temperature. The sampling capacitors for the switched-capacitor circuit may vary with IC process and temperature, and the amount of bias current required for a given speed may thus change with IC process and temperature. The bias current may be generated to be proportional to the size of the sampling capacitors within the switched-capacitor circuit. This may ensure that the speed of the switched-capacitor circuit and the resulting performance will be sufficient across variations in IC process and temperature.

In one design, the bias current of the switched-capacitor circuit may be adaptively generated based on a selected mode of operation. The switched-capacitor circuit may be operated at different sampling rates in different modes. The sampling rate for each mode may be selected based on (e.g., proportional to) the signal bandwidth for that mode. In one design, the bias current is proportional to the sampling rate or frequency. This may ensure that the speed of the switched-capacitor circuit is sufficient for each mode.

Figure 5:
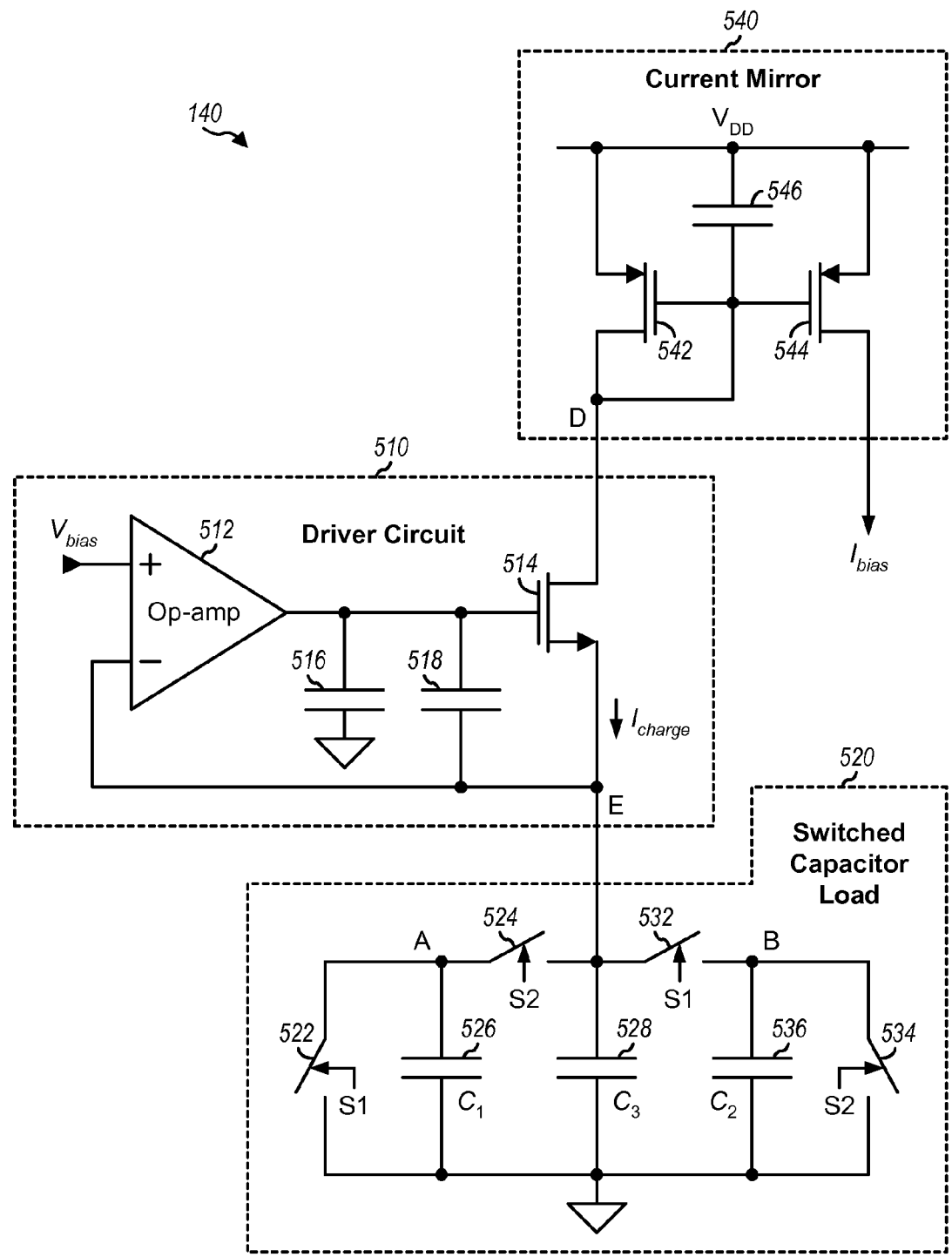
FIG. 5 shows a schematic diagram of a bias circuit.

FIG. 5 shows a schematic diagram of a design of bias circuit 140 in FIG. 1. Bias circuit 140 can adaptively generate a bias current for a switched-capacitor circuit (e.g., ΣΔ ADC 130) based on a selected mode and to track variations in IC process and temperature. In the design shown in FIG. 5, bias circuit 140 includes a driver circuit 510, a switched capacitor load 520, and a current mirror 540.

Within driver circuit 510, an operational amplifier (op-amp) 512 has its non-inverting input receiving a bias voltage $V_{bias}$ and its inverting input coupled to node C. An NMOS transistor 514 has its source coupled to node C, its gate coupled to the output of op-amp 512, and its drain coupled to node D. A capacitor 516 is coupled between the output of op-amp 512 and circuit ground. A capacitor 518 is coupled between the gate and the source of NMOS transistor 514.

Switched capacitor load 520 is coupled between node C and circuit ground. Within switched capacitor load 520, a switch 522 and a capacitor 526 are coupled in parallel, and the combination is coupled between node A and circuit ground. A switch 524 is coupled between node A and node C. A switch 532 is coupled between node B and node C. A switch 534 and a capacitor 536 are coupled in parallel, and the combination is coupled between node B and circuit ground. A capacitor 528 is coupled between node C and circuit ground. Switches 522 and 532 are controlled by an S1 control signal, and switches 524 and 534 are controlled by an S2 control signal.

Capacitors 526 and 536 may be implemented with the same type of capacitors used in the switched-capacitor circuit. Various types of capacitor may be available such as a metal capacitor, a MOS capacitor, etc. By implementing capacitors 526 and 536 with the same type as the switching capacitors in the switched-capacitor circuit, the bias current generated by bias circuit 140 can more accurately track changes in capacitor size due to IC process and temperature variations.

Current mirror 540 is coupled between node D and a power supply voltage $V_{DD}$. Within current mirror 540, PMOS transistors 542 and 544 have their sources coupled to the supply voltage and their gates coupled together and to node D. The drain of PMOS transistor 542 is also coupled to node D, and the drain of PMOS transistor 544 provides the bias current $I_{bias}$. A capacitor 546 is coupled between the supply voltage and the gates of PMOS transistors 542 and 544.

The bias voltage $V_{bias}$ may be generated with a bandgap voltage reference and may be approximately constant across IC process and temperature variations. The bias voltage $V_{bias}$ may also be generated with other voltage references and may have any suitable value. Op-amp 512 and NMOS transistor 514 operate as a feedback circuit that provides a voltage of $V_{bias}$ at node C. Capacitor 516 compensates the feedback loop so that it is stable. Capacitor 518 reduces current spikes when NMOS transistor 514 is charging capacitor 526 or 536.

Switched capacitor load 520 realizes an equivalent resistor by averaging the charge transfer in capacitors 526 and 536 over one clock cycle. The average charging current $I_{charge}$ provided by NMOS transistor 514 is dependent on the equivalent resistor and the $V_{bias}$ voltage at node C.

Figure 6:
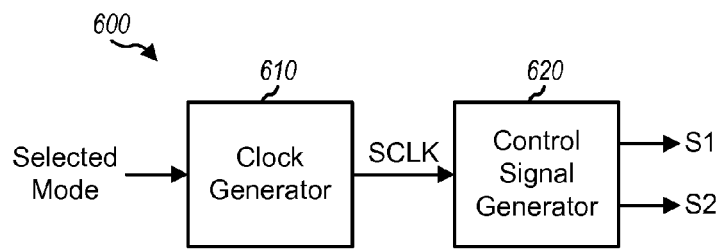
FIG. 6 shows a block diagram of a circuit to generate control signals for the bias circuit.

FIG. 6 shows a block diagram of a design of a circuit 600 to generate the S1 and S2 control signals for bias circuit 140. Circuit 600 may be part of controller/processor 160 in FIG. 1 or part of some other unit within wireless device 100.

Within circuit 600, a clock generator 610 receives a selected mode for wireless device 100 and generates the sampling clock SCLK based on the selected mode. The frequency or rate of the sampling clock may be determined based on the signal bandwidth and/or other factors associated with the selected mode. A control signal generator 620 receives the sampling clock and generates the S1 and S2 control signals for the switches within switched capacitor load 520.

Figure 7:
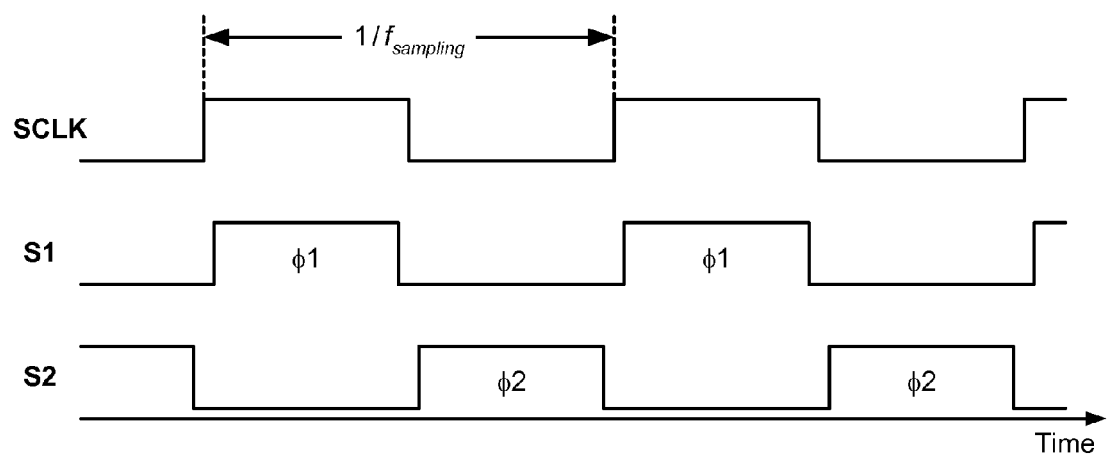
FIG. 7 shows a timing diagram for the control signals.

FIG. 7 shows a timing diagram for the S1 and S2 control signals. The top of FIG. 7 shows the sampling clock, which has a frequency of f sampling determined by the selected mode. The S1 signal is at logic high during a first phase φ1 when the sampling clock is at logic high. Conversely, the S2 signal is at logic high during a second phase φ2 when the sampling clock is at logic low. The S1 and S2 signals are non-overlapping and have frequency of f sampling. Each control signal has a duty cycle of less than 50%.

Referring back to FIG. 5, capacitors 526 and 536 are periodically charged and discharged at the sampling rate via switches 522, 524, 532 and 534. During the first phase φ1, switches 522 and 532 are closed by the logic high on the S1 signal, and switches 524 and 534 are opened by the logic low on the S2 signal. Capacitor 526 is discharged via switch 522, and capacitor 536 is charged by NMOS transistor 514 via switch 532.

During the second phase φ2, switches 522 and 532 are opened by the logic low on the S1 signal, and switches 524 and 534 are closed by the logic high on the S2 signal. Capacitor 526 is charged by NMOS transistor 514 via switch 524, and capacitor 536 is discharged via switch 534.

Capacitors 526 and 536 are thus charged on alternate sampling clock phases by NMOS transistor 514, and each capacitor is charged and discharged on complementary clock phases. The average charging current provided by NMOS transistor 514 may be expressed as:

$$I_{charge} = f_{sampling} \cdot (C_1 + C_2) \cdot V_{bias},\qquad\text{Eq (2)}$$

where $C_1$ is the capacitance of capacitor 526 and $C_2$ is the capacitance of capacitor 536. Capacitors 526 and 536 may have the same size, so that $C_1 = C_2$.

As shown in equation (2), the average charging current $I_{charge}$ is determined by and is proportional to the bias voltage $V_{bias}$, the sampling rate $f_{sampling}$, and the capacitances $C_1$ and $C_2$ of capacitors 526 and 536, respectively. For higher sampling rate, capacitors 526 and 536 are charged and discharged more often, and the charging current is thus proportional to the sampling rate. For larger capacitors 526 and 536, more current is used to charge these capacitors to the bias voltage in each sampling clock cycle, and the charging current is thus proportional to the sizes of these capacitors.

Capacitor 528 smoothes and filters the charging current and has a capacitance of $C_3$, which may be larger than the total capacitance of capacitors 526 and 536, or $C_3 > (C_1 + C_2)$. Capacitor 528 functions as a large charge bank that smoothes spikes in the charging current whenever switches 524 and 532 are closed. Capacitor 528 and the equivalent resistor resulting from periodically charging and discharging capacitors 526 and 536 introduce an extra pole to the feedback loop, and stability of this loop is ensured with capacitor 516.

Current mirror 540 generates the bias current $I_{bias}$ such that it mirrors the average charging current $I_{charge}$. In one design, PMOS transistors 542 and 544 have the same size, and the bias current is approximately equal to the charging current. In another design, PMOS transistors 542 and 544 have different sizes, and the bias current is dependent on the ratio of the PMOS transistor sizes. For example, PMOS transistor 544 may be larger than PMOS transistor 542 by a factor of M, and the bias current would then be M times larger than the charging current. This design may reduce power consumption of bias circuit 140. Capacitor 546 prevents the gate voltage of PMOS transistors 542 and 544 from changing and thus provides additional filtering.

As shown in equation (2), the design shown in FIG. 5 allows the bias current $I_{bias}$ to be adaptively generated based on the selected mode. The bias current is proportional to the sampling rate, which may be determined based on the selected mode. For modes with higher speed, higher sampling rate is applied, and larger bias current is generated by bias circuit 140 for the ΣΔ ADC.

The design in FIG. 5 also allows the bias current to track changes in sampling capacitors in the integrators for the ΣΔ ADC due to variations in IC process and temperature. The bias current is proportional to capacitances $C_1$ and $C_2$ of capacitors 526 and 536, which may vary over IC process and temperature in the same manner as the sampling capacitors. For example, if the sampling capacitors within the ΣΔ ADC becomes larger due to IC process and temperature variations (e.g., hot temperature and/or slow IC process), then capacitors 526 and 536 would become larger by approximately the same percentage, and bias circuit 140 would generate a proportionally larger bias current, which would then allow the OTAs within the ΣΔ ADC to move charges faster.

Figure 8:
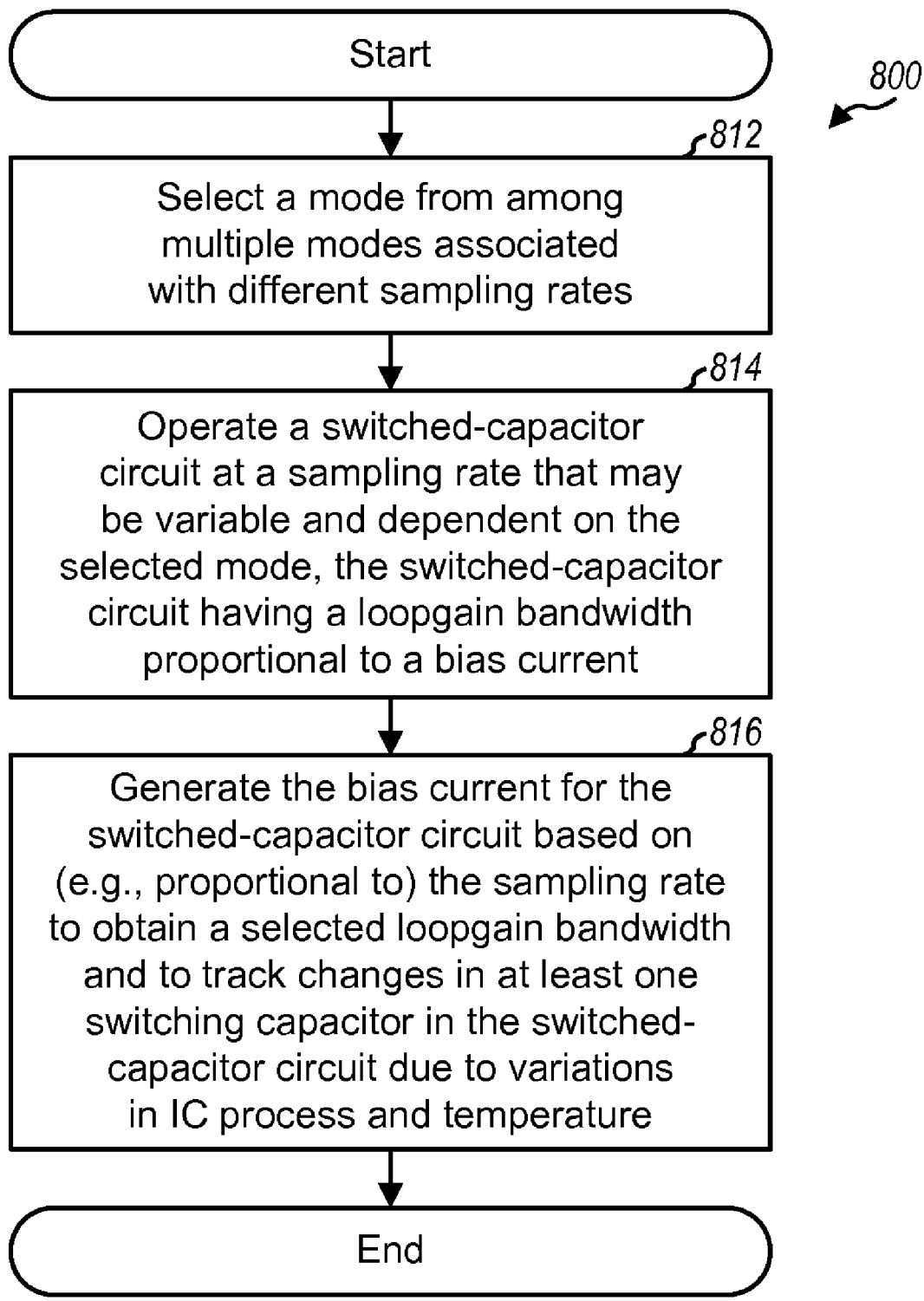
FIG. 8 shows a process for adaptively generating bias current for a switched-capacitor circuit.

FIG. 8 shows a design of a process 800 for adaptively generating bias current for a switched-capacitor circuit (e.g., a ΣΔ ADC). A mode may be selected from among multiple modes associated with different sampling rates (block 812). The switched-capacitor circuit may be operated at a sampling rate that may be variable and dependent on the selected mode (block 814). The switched-capacitor circuit may have a loop-gain bandwidth that is proportional to a bias current. In one design, the switched-capacitor circuit may comprise a ΣΔ ADC that digitalizes an analog signal at the sampling rate and provides digital samples.

A bias current for the switched-capacitor circuit may be generated based on (e.g., proportional to) the sampling rate for the switched-capacitor circuit to obtain a selected loop-gain bandwidth and to track changes in at least one switching capacitor in the switched-capacitor circuit due to variations in IC process and temperature (block 816). The bias current may be generated based on (i) at least one capacitor that tracks the at least one switching capacitor in the switched-capacitor circuit through variations in IC process and temperature and/or (ii) a bias voltage that may be generated with a bandgap or some other voltage reference.

In one design of block 816, a first capacitor (e.g., capacitor 526) may be discharged based on a first control signal and charged based on a second control signal. A second capacitor (e.g., capacitor 536) may be discharged based on the second control signal and charged based on the first control signal. The charging current for the first capacitor and the charging current for the second capacitor may be filtered (e.g., with capacitor 528, capacitor 546, etc.) to obtain an average charging current. The bias current may then be generated based on (e.g., as a current mirror of) the average charging current. The bias current may also be adaptively generated in other manners such that it is proportional to the sampling rate and/or tracks variations in IC process and temperature.

Computer simulation was performed to measure settling time of OTAs within ΣΔ ADC 130 over IC process and temperature variations. Settling time is the amount of time it takes an OTA to transfer charges between capacitors with a specified accuracy. The computer simulation measured (i) the settling time of OTAs with bias current adaptively generated based on the design shown in FIG. 5 and (ii) the setting time of OTAs with bias current generated by applying the $V_{bias}$ voltage across a fixed resistor. The computer simulation indicated that the settling time with the adaptively generated bias current has much less spread across IC process and temperature variations than the settling time with the conventionally generated bias current.

The techniques described herein may be able to reduce power consumption and improve performance for a ΣΔ ADC and other switched-capacitor circuits since the adaptively generated bias current can ensure sufficient speed for worst-case conditions, without the need for a large margin for the bias current. The performance of the ΣΔ ADC and other switched-capacitor circuits may also vary within a tighter range across IC process and temperature corners with the use of the adaptively generated bias current, which may improve yield. The techniques are especially beneficial when a large number of modes are supported. For example, there may be 10 modes for UMB with different sampling rates. The techniques can readily generate different bias currents for all of the modes to achieve lower power consumption and good ADC performance.

The techniques and the bias circuit described herein may be implemented on an IC, an analog IC, an RFIC, a mixed-signal IC, an ASIC, a printed circuit board (PCB), an electronics device, etc. The bias circuit may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the techniques described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a switched-capacitor circuit comprising at least one switching capacitor and an amplifier, the switched-capacitor circuit operative to charge and discharge the at least one switching capacitor at a sampling rate, the amplifier having a bandwidth proportional to a bias current; and
   a bias circuit coupled to the switched-capacitor circuit and operative to generate the bias current for the switched-capacitor circuit, the bias current tracking changes in the at least one switching capacitor due to variations in integrated circuit (IC) process and temperature such that the amplifier has a bandwidth proportional to the sampling rate.

2. The apparatus of claim 1, wherein the bias circuit is operative to generate the bias current based on at least one capacitor tracking the at least one switching capacitor in the switched-capacitor circuit through variations in IC process and temperature.

3. The apparatus of claim 1, wherein the sampling rate for the switched-capacitor circuit is variable, and wherein the bias circuit is operative to generate the bias current to be proportional to the sampling rate.

4. The apparatus of claim 2, wherein the bias circuit is operative to generate the bias current based further on a bias voltage.

5. The apparatus of claim 1, wherein the amplifier comprises an operational transconductance amplifier (OTA) having at least one metal oxide semiconductor (MOS) transistor providing signal gain and operating in a weak inversion region.

6. The apparatus of claim 1, wherein the switched-capacitor circuit comprises a sigma-delta analog-to-digital converter (ΣΔ ADC) operative to digitize an analog signal at the sampling rate and provide digital samples.

7. The apparatus of claim 6, wherein the sampling rate is determined based on a mode selected from among multiple modes associated with different sampling rates, and wherein the bias circuit is operative to generate the bias current to be proportional to the sampling rate for the ΣΔ ADC.

8. The apparatus of claim 7, wherein settling time of the switched-capacitor circuit tracks with the multiple modes and across IC process and temperature variations.

9. The apparatus of claim 1, wherein the switched-capacitor circuit comprises a filter or a decimator.

10. The apparatus of claim 1, wherein the bias circuit comprises
a switched capacitor load operative to draw an average charging current and comprising a first capacitor coupled to first and second switches, the first switch discharging the first capacitor based on a first control signal, the second switch charging the first capacitor based on a second control signal, and the average charging current being determined based on charging current for the first capacitor.

11. The apparatus of claim 10, wherein the switched capacitor load further comprises a second capacitor coupled to third and fourth switches, the third switch discharging the second capacitor based on the second control signal, the fourth switch charging the second capacitor based on the first control signal, and the average charging current being determined based further on charging current for the second capacitor.

12. The apparatus of claim 11, wherein the switched capacitor load further comprises a third capacitor coupled to the second and third switches and operative to filter the charging current for the first and second capacitors.

13. The apparatus of claim 10, wherein the bias circuit further comprises
a driver circuit coupled to the switched capacitor load and operative to receive a bias voltage and provide the average charging current.

14. The apparatus of claim 13, wherein the driver circuit comprises
a transistor operative to provide the average charging current, and an operational amplifier coupled to the transistor and operative to receive the bias voltage and drive the transistor.

15. The apparatus of claim 14, wherein the driver circuit further comprises
a capacitor coupled between a gate and a source of the transistor and operative to filter spikes in the charging current for the first capacitor.

16. The apparatus of claim 10, wherein the bias circuit further comprises
a current mirror operative to receive the average charging current and provide the bias current.

17. The apparatus of claim 16, wherein the current mirror comprises
first and second transistors having sources coupled together and gates coupled together, the first transistor operative to provide the average charging current and the second transistor operative to provide the bias current, and
a capacitor coupled between the gates and the sources of the first and second transistors and operative to provide filtering for the bias current.

18. The apparatus of claim 1, wherein the apparatus is an integrated circuit.

19. A method comprising:
operating a switched-capacitor circuit at a sampling rate, the switched-capacitor circuit having a bandwidth proportional to a bias current; and
generating the bias current for the switched-capacitor circuit to obtain a bandwidth proportional to the sampling rate and to track changes in at least one switching capacitor in the switched-capacitor circuit due to variations in integrated circuit (IC) process and temperature.

20. The method of claim 19, wherein the switched-capacitor circuit comprises a sigma-delta analog-to-digital converter (ΣΔ ADC), and wherein the operating the switched-capacitor circuit at the sampling rate comprises digitizing an analog signal with the ΣΔ ADC at the sampling rate to obtain digital samples.

21. The method of claim 19, further comprising:
selecting a mode from among multiple modes associated with different sampling rates; and
generating the bias current to be proportional to the sampling rate for the selected mode.

22. The method of claim 19, wherein the generating the bias current comprises generating the bias current based on at least one capacitor tracking the at least one switching capacitor in the switched-capacitor circuit through variations in IC process and temperature.

23. The method of claim 19, wherein the generating the bias current comprises
discharging a first capacitor based on a first control signal,
charging the first capacitor based on a second control signal, and
generating the bias current based on charging current for the first capacitor.

24. The method of claim 23, wherein the generating the bias current further comprises
discharging a second capacitor based on the second control signal,
charging the second capacitor based on the first control signal, and
generating the bias current based further on charging current for the second capacitor.

25. The method of claim 24, wherein the generating the bias current further comprises filtering the charging current for the first and second capacitors to obtain an average charging current, and generating the bias current based on the average charging current.

26. An apparatus comprising:

means for operating a switched-capacitor circuit at a sampling rate, the switched-capacitor circuit having a bandwidth proportional to a bias current; and means for generating a bias current for the switched-capacitor circuit to obtain a bandwidth proportional to the sampling rate and to track changes in at least one switching capacitor in the switched-capacitor circuit due to variations in integrated circuit (IC) process and temperature.

27. The apparatus of claim 26, wherein the switched-capacitor circuit comprises a sigma-delta analog-to-digital converter ($\Sigma\Delta$ ADC), and wherein the means for operating the switched-capacitor circuit at the sampling rate comprises means for digitizing an analog signal with a sigma-delta analog-to-digital converter ($\Sigma\Delta$ ADC) at the sampling rate to obtain digital samples.

28. The apparatus of claim 26, further comprising:

means for selecting a mode from among multiple modes associated with different sampling rates; and means for generating the bias current to be proportional to the sampling rate for the selected mode.

29. The apparatus of claim 26, wherein the means for generating the bias current comprises means for generating the bias current based on at least one capacitor tracking the at least one switching capacitor in the switched-capacitor circuit through variations in IC process and temperature.

* * * * *